United States Patent
Moest

(10) Patent No.: US 7,675,605 B2
(45) Date of Patent: Mar. 9, 2010

(54) DEVICE AND METHOD FOR TRANSMISSION IMAGE SENSING

(75) Inventor: Bearrach Moest, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 12/155,502

(22) Filed: Jun. 5, 2008

(65) Prior Publication Data

US 2009/0002710 A1    Jan. 1, 2009

Related U.S. Application Data

(63) Continuation of application No. 11/819,958, filed on Jun. 29, 2007.

(51) Int. Cl.
*G03B 27/54* (2006.01)
*G03B 27/32* (2006.01)
*G03B 27/42* (2006.01)

(52) U.S. Cl. .............. 355/67; 355/77; 355/53

(58) Field of Classification Search ........... 355/53, 355/30, 55, 67, 77, 72, 75; 356/399, 400, 356/401

See application file for complete search history.

(56) References Cited

U.S. PATENT DOCUMENTS

| | | | |
|---|---|---|---|
| 2005/0030506 A1* | 2/2005 | Schuster ............... | 355/55 |
| 2005/0078287 A1* | 4/2005 | Sengers et al. ........ | 355/30 |
| 2007/0091290 A1 | 4/2007 | Van De Kerkhof et al. | |
| 2009/0002656 A1 | 1/2009 | Moest | |

FOREIGN PATENT DOCUMENTS

| | | |
|---|---|---|
| EP | 1 510 870 A1 | 3/2005 |
| EP | 1 637 930 A2 | 3/2006 |

OTHER PUBLICATIONS

Bearrach Moest, "Device and Method for Transmission Image Detection, Lithorgraphic Apparatus and Mask for use in a Lithorgraphic Apparatus", U.S. Appl. No. 11/819,958 filed Jun. 29, 2007.

Non-Final Rejection mailed Feb. 23, 2009 for U.S. Appl. No. 11/819,958 filed Jun. 29, 2007, 7 pgs.

* cited by examiner

*Primary Examiner*—Peter B Kim
(74) *Attorney, Agent, or Firm*—Sterne, Kessler, Goldstein & Fox P.L.L.C.

(57) ABSTRACT

A device for transmission image sensing for sensing an aerial image in a lithographic exposure apparatus comprises a projection system arranged to form, at an image side of the projection system, an aerial image of an object mark. The device further comprises a detector comprising a slit pattern having features corresponding to at least a part of the aerial image. The slit pattern is arranged to be exposed to the aerial image. The detector is further being arranged to detect detection radiation transmitted by the slit pattern; wherein $$d < 0.85 \cdot \frac{\lambda}{NA},$$

where d represents the dimension of the smallest feature of the slit pattern, λ represents the intended wavelength of the detection radiation, and NA, which is larger than 1, represents the numerical aperture of the image side.

12 Claims, 6 Drawing Sheets

DEVICE AND METHOD FOR TRANSMISSION IMAGE SENSING

CROSS REFERENCE TO RELATED APPLICATIONS

This application is a continuation of U.S. application Ser. No. 11/819,958, filed Jun. 29, 2007, the entire content of which is incorporated herein by reference.

BACKGROUND

The present invention relates to a device for transmission image sensing and a method for transmission image sensing.

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In device manufacturing methods using a lithographic apparatus, an important factor in the yield, i.e. the percentage of correctly manufactured devices, is the accuracy within which layers are printed in relation to layers that have previously been formed. This is known as overlay, and the overlay error budget will often be 10 nm or less. To achieve such accuracy, the substrate must be aligned to the reticle pattern to be transferred with great accuracy.

A number of sensors is used at substrate level for evaluating and optimizing imaging performance. These may include transmission image sensors (TIS). A TIS is a sensor that is used to measure at substrate level the position of a projected aerial image of a mark pattern at mask (reticle) level. The projected image at substrate level may be a line pattern with a line width comparable to the wavelength of the exposure radiation. The TIS measures the aforementioned mark pattern using a transmission pattern with a photocell underneath it. The sensor data may be used to measure the position of the reticle with respect to the substrate table in six degrees of freedom, i.e. three degrees of freedom related to translation and three degrees of freedom related to rotation. Moreover, magnification and scaling of the projected mark pattern may be measured. With a small line width, the sensor is capable of measuring the pattern positions and influences of several illumination settings, e.g. annular, dipole, for several mask types (e.g. binary mask, phase-shift mask). The TIS may also be used to measure optical performance of a tool, like a lithographic projection apparatus. By using different illumination settings in combination with different projected images, properties such as pupil shape, coma, spherical aberration, astigmatism and field curvature can be measured.

With the continual desire to image ever smaller patterns to create devices with higher component densities, there is pressure to reduce overlay errors, which leads to a desire for improved sensors.

SUMMARY

It is desirable to provide a sensor at substrate level with high sensitivity that can be used in high NA systems, i.e. immersion lithographic apparatus.

To that end, the invention provides a device for transmission image sensing for sensing an aerial image in a lithographic exposure apparatus, the device comprising:

a projection system arranged to form, at an image side of the projection system, an aerial image of an object mark, the image side having a numerical aperture larger than 1; and a detector comprising a slit pattern (G1) having features arranged to correspond to at least a part of the aerial image, the slit pattern being arranged to be exposed to the aerial image, the detector further being arranged to detect detection radiation transmitted by the slit pattern; wherein $$d < 0.85 \cdot \frac{\lambda}{NA},$$

where d represents the dimension of the smallest feature of the slit pattern, $\lambda$ represents the intended wavelength of the detection radiation, and NA represents the numerical aperture of the image side.

The invention further provides a method for transmission image sensing of an aerial image comprising:

providing detection radiation;

using a projection system and the detection radiation to form on an image side of the projection system an aerial image of an object mark, the image side having a numerical aperture larger than 1;

exposing a slit pattern to the image, the slit pattern having features corresponding to at least a part of the aerial image;

detecting the detection radiation transmitted by the slit pattern;

wherein $$d < 0.85 \cdot \frac{\lambda}{NA},$$

where d represents the smallest dimension of any feature in the aerial image, $\lambda$ represents the wavelength of the detection radiation, and NA represents the numerical aperture of the image side.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
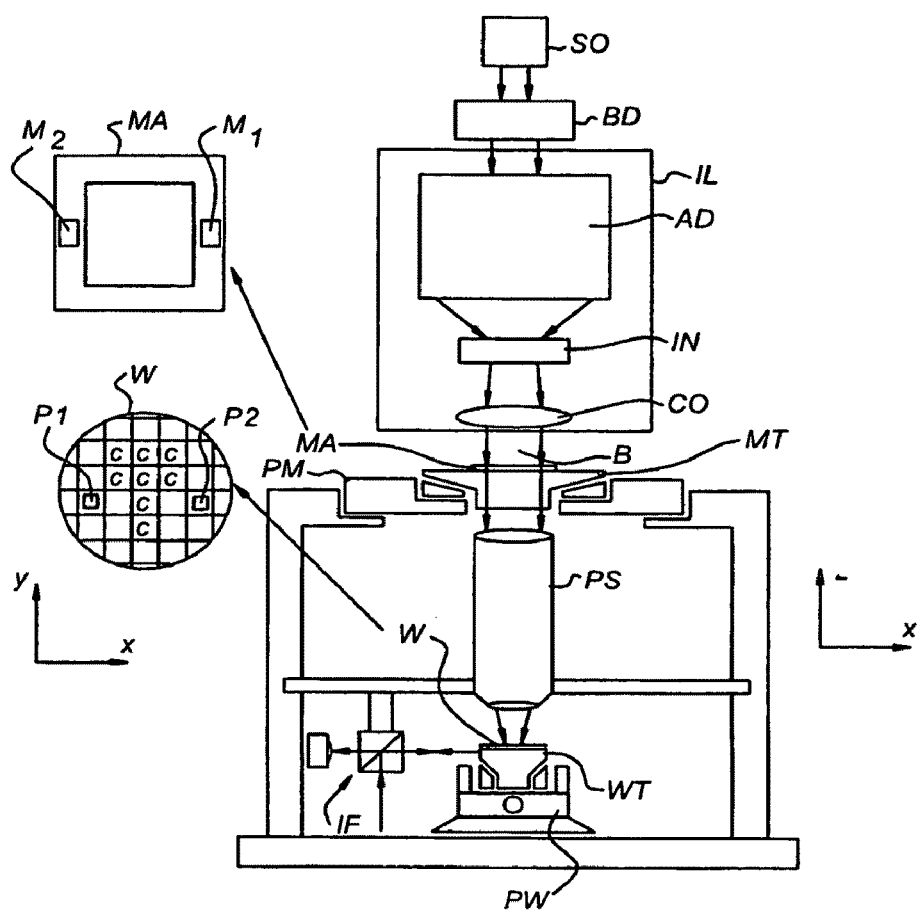
FIG. 1 depicts a lithographic apparatus according to an embodiment of the invention.

FIG. 1 schematically depicts a lithographic apparatus according to one embodiment of the invention. The apparatus comprises:

- an illumination system (illuminator) IL configured to condition a radiation beam B (e.g. UV radiation or EUV-radiation)
- a support structure (e.g. a mask table) MT constructed to support a patterning device (e.g. a mask) MA and connected to a first positioner PM configured to accurately position the patterning device in accordance with certain parameters
- a substrate table (e.g. a wafer table) WT constructed to hold a substrate (e.g. a resist-coated wafer) W and connected to a second positioner PW configured to accurately position the substrate in accordance with certain parameters
- a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT supports, i.e. bears the weight of, the patterning device MA. It holds the patterning device MA in a manner that depends on the orientation of the patterning device MA, the design of the lithographic apparatus, and other conditions, such as for example whether or not the patterning device MA is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system PS. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion C of the substrate W. It should be noted that the pattern imparted to the radiation beam B may not exactly correspond to the desired pattern in the target portion C of the substrate W, for example if the pattern includes phase-shifting features or so-called assist features. Generally, the pattern imparted to the radiation beam B will correspond to a particular functional layer in a device being created in the target portion C, such as an integrated circuit.

The patterning device MA may be transmissive or reflective. Examples of patterning devices MA include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system."

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual-stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate W may be covered by a liquid having a relatively high refractive index, e.g. water, so as to fill a space between the projection system PS and the substrate W. An immersion liquid may also be applied to other spaces in the lithographic apparatus, for example, between the mask MA and the projection system PS. Immersion techniques are well known in the art for increasing the numerical aperture of projection systems. The term "immersion" as used herein does not mean that a structure, such as a substrate, must be submerged in liquid, but rather only means that liquid is located between the projection system PS and the substrate W during exposure.

Referring to FIG. 1, the illuminator IL receives a radiation beam B from a radiation source SO. The source SO and the lithographic apparatus may be separate entities, for example when the source SO is an excimer laser. In such cases, the source SO is not considered to form part of the lithographic apparatus and the radiation beam B is passed from the source SO to the illuminator IL with the aid of a beam delivery system BD comprising, for example, suitable directing mirrors and/or a beam expander. In other cases, the source SO may be an integral part of the lithographic apparatus, for example when the source SO is a mercury lamp. The source SO and the illuminator IL, together with the beam delivery system BD if required, may be referred to as a radiation system.

The illuminator IL may comprise an adjuster AD for adjusting the angular intensity distribution of the radiation beam B. Generally, at least the outer and/or inner radial extent (commonly referred to as σ-outer and σ-inner, respectively) of the intensity distribution in a pupil plane of the illuminator IL can be adjusted. In addition, the illuminator IL may comprise various other components, such as an integrator IN and a condenser CO. The illuminator IL may be used to condition the radiation beam B, to have a desired uniformity and intensity distribution in its cross-section.

The radiation beam B is incident on the patterning device (e.g., mask MA), which is held on the support structure (e.g., mask table MT), and is patterned by the patterning device MA. Having traversed the mask MA, the radiation beam B passes through the projection system PS, which focuses the beam B onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner), the mask table MT may be connected to a short-stroke actuator only, or may be fixed. Mask MA and substrate W may be aligned using mask alignment marks M1, M2 and substrate alignment marks P1, P2. Although the substrate alignment marks P1,P2 as illustrated occupy dedicated target portions, they may be located in spaces between target portions (these are known as scribe-lane alignment marks). Similarly, in situations in which more than one die is provided on the mask MA, the mask alignment marks M1,M2 may be located between the dies.

The depicted apparatus could be used in at least one of the following modes:

1. In step mode, the mask table MT and the substrate table WT are kept essentially stationary, while an entire pattern imparted to the radiation beam B is projected onto a target portion C at one time (i.e. a single static exposure). The substrate table WT is then shifted in the X direction and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam B is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes a programmable patterning device, such as a programmable mirror array of a type as referred to above.

Combinations and/or variations on the above described modes of use or entirely different modes of use may also be employed.

Figure 2:
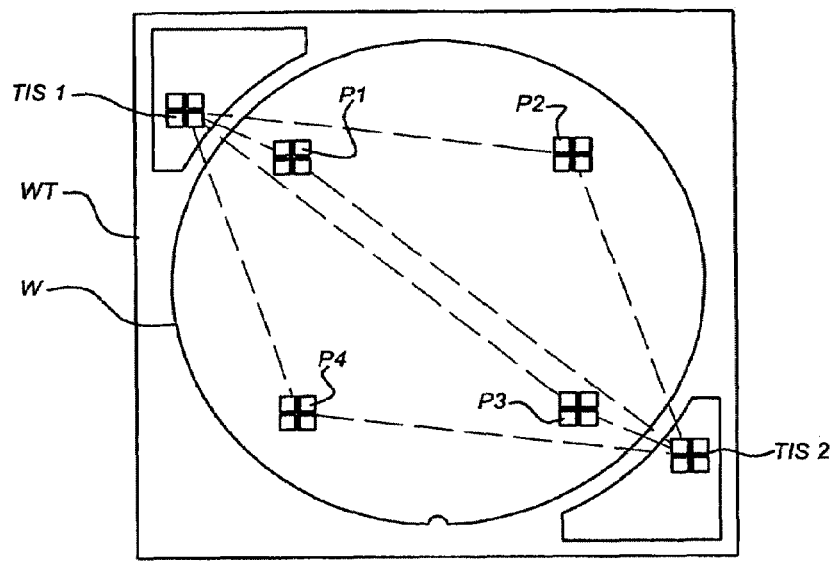
FIG. 2 schematically depicts an arrangement of the substrate table depicted in the lithographic apparatus of FIG. 1.

FIG. 2 schematically depicts an arrangement of the substrate table WT depicted in the lithographic apparatus of FIG. 1. On the substrate table WT, two fixed marks TIS1 and TIS2 are provided. The fixed marks TIS1 and TIS2 have integrated into them an image sensor that can be used to determine a location of an aerial image of an object mark on the mask MA by scanning the image sensor through the aerial image.

Consequently, the relative position of the image of the object mark on the mask MA and the fixed marks TIS1, TIS2 can be determined. If the substrate table WT is provided with a substrate W comprising substrate marks, e.g. substrate marks P1, P2, P3, P4 as depicted in FIG. 2, an alignment sensor (not shown) may have previously determined the relative positions of the substrate marks P1, P2, P3, P4. The knowledge of the relative positions of the substrate marks P1, P2, P3, P4 obtained by the alignment sensor combined with the knowledge of the relative position of the image of the object mark on the mask MA and the fixed marks TIS1, TIS2 measured by the image sensors within TIS1, TIS2, allow the substrate W to be positioned at any desired position relative to the projected image of the mask MA with great accuracy.

Figure 3:
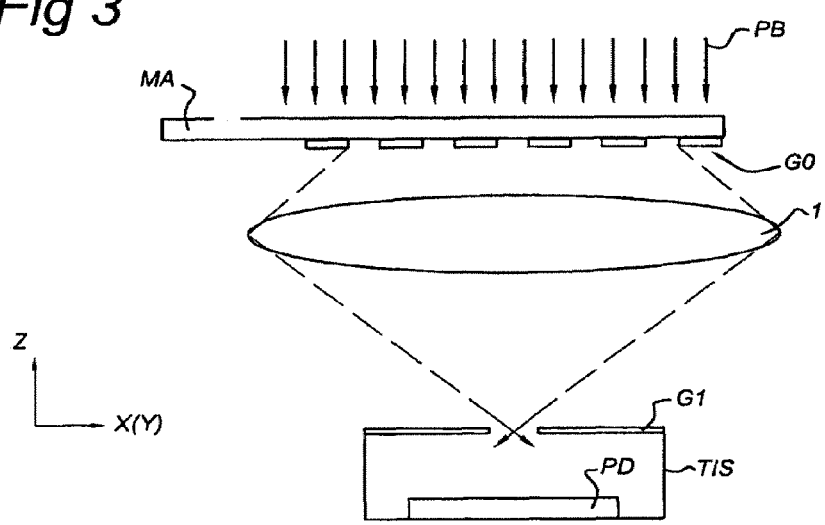
FIG. 3 schematically depicts a device for transmission image detection.

FIG. 3 schematically depicts an embodiment of a device TIS for transmission image detection, for example transmission image sensor TIS1, TIS2 as depicted in FIG. 2. Such a device is known in the art. The device TIS for transmission image detection comprises a slit pattern G1 and a photo sensor device PD. The device TIS for transmission image detection is positioned underneath the projection system PS, at a side facing the substrate table WT. The device TIS for transmission image detection uses an object mark G0, e.g. a first grating. In FIG. 3, the object mark G0 is provided on the mask MA. Alternatively, the object mark G0 may be provided on the mask table MT.

The object mark G0 is arranged to form a pattern upon illumination by the projection beam PB in the projection beam's cross section. The pattern present in the cross-section of the projection beam PB as a result of object mark G0, passes through one or more lenses 1, e.g. through lenses in projection system PS. The optical properties of such a projection system PS are such that an aerial image of object mark G0 is formed.

The device TIS for transmission image detection is arranged to detect the aerial image of the object mark G0. The device TIS for transmission image detection can move relative to the position of the projection system PS and the mask MA in at least three directions, e.g. three orthogonal directions X, Y and Z. By scanning along these three directions, an intensity of the aerial image can be mapped as a function of X, Y and Z-positions of the device TIS for transmission image detection. The resulting map may be an image map (a 3D map) which comprises coordinates of sampling locations and a sampled intensity at each sampling location. During this procedure, the aerial image may be projected using a relatively large depth of focus, different from the depth of focus during exposure of a pattern in mask MA on a substrate W.

The orientation of a critical dimension of the object mark G0 is similar to the orientation of a critical dimension of the corresponding slit pattern G1. Thus, if the object mark extends in a first direction, e.g. the X-direction, and has a critical dimension in a second direction orthogonal to the first direction, e.g. the Y-direction, the corresponding slit pattern G1 also extends in the first direction and also has a critical dimension in the second direction.

Generally, the slit pattern G1 is positioned in a plane proximate to an image plane of the projection system PS. In its simplest embodiment, the slit pattern G1 is an opening over the photo sensor device PD which may have the shape of a slit or a square. In a further embodiment thereof, the opening has a well-defined edge.

In a more intricate embodiment, the slit pattern G1 is similar in shape to the object mark G0. Additionally, feature sizes of slit pattern G1 may be substantially equal to the feature sizes of object mark G0 multiplied by magnification factor M of the projection system PS. Applying a pattern on the opening over the photo sensor device PD increases the number of edges which may improve the sensitivity of the photo sensor PD.

In yet another embodiment, the device TIS for transmission image detection may comprise at least two slit patterns G1, one arranged for image detection in a first direction, e.g. the X-direction, and one arranged for image detection in a second direction orthogonal to the first direction, e.g. the Y-direction. The aerial image in this embodiment can be detected in both X and Y directions simultaneously. In this embodiment, object mark G0 in the mask MA comprises at least two mark elements, e.g. a grating, isolated line or isolated slit. A first mark element may be arranged for image creation in the first direction, e.g. the X-direction, which image will be received by a portion of the slit pattern G1 arranged for image detection in the first direction. The second mark element may be arranged for image creation in the second direction orthogonal thereto, e.g. the Y-direction, which image will be received by a portion of the slit pattern G1 arranged for image detection in the second direction. The images created by the two mark elements of object mark G0 are created simultaneously.

By using the aforementioned mapping, e.g. in the form of a 3D map, computation devices like processors or microprocessors connected to the device TIS for transmission image detection, may derive a position of the aerial image, e.g. by using a parabolic fit using a least squares fitting method. Such a computational device may be a processor, e.g. a processor or microprocessor in a dedicated processing device like a controller system or a general purpose computer system or other computer system, which can be programmably instructed to perform the mapping and associated computation.

Figure 8:
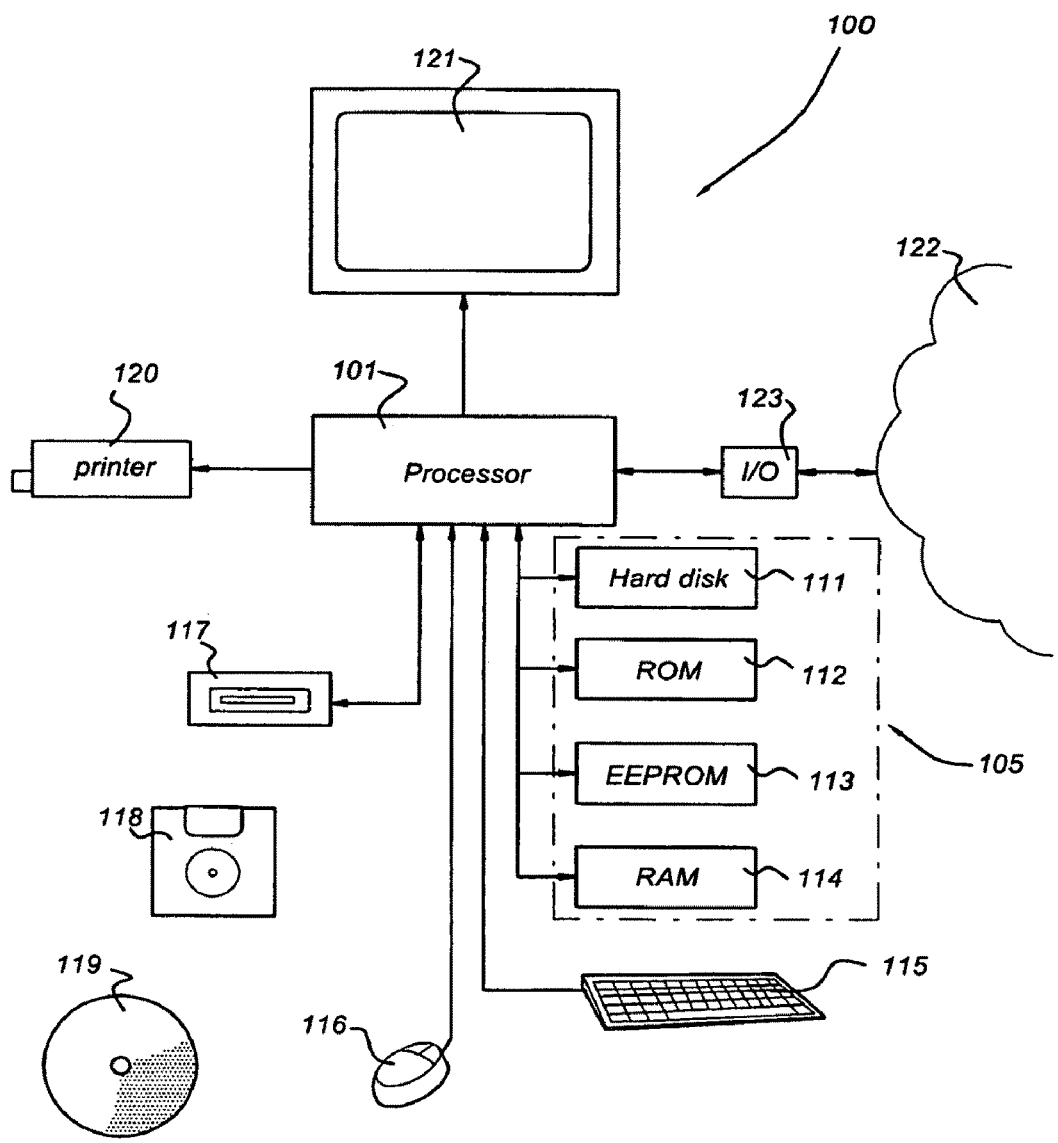
FIG. 8 shows an embodiment of a computer assembly that may be used by an assembly according to an embodiment of the present invention.

FIG. 8 provides an example of computational devices, e.g. a processor, arranged for determining a position of an aerial image and also for performing methods according to the present invention.

Figure 4A:
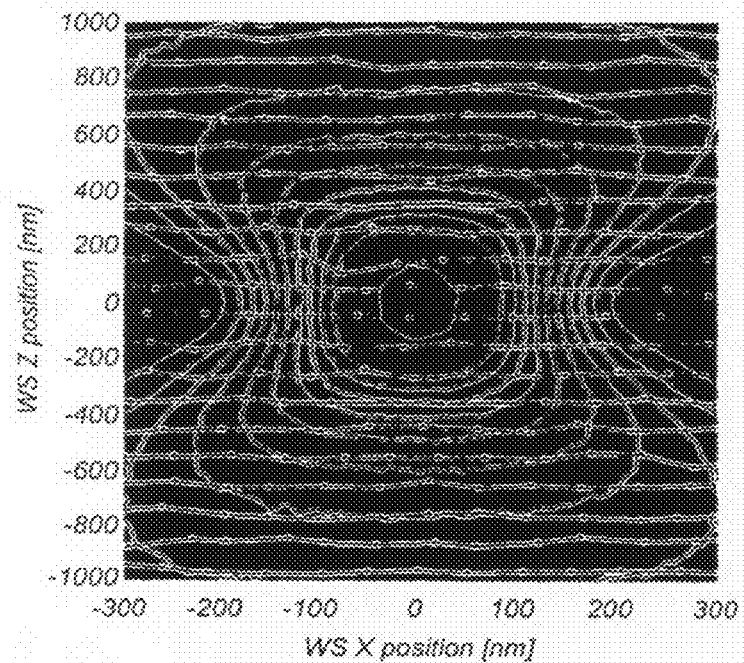
FIGS. 4a and 4b depict an exemplary intensity distribution of an aerial image detected by the device for transmission image detection of FIG. 2 in a contour plot and a 3D plot, respectively.
Figure 4B:
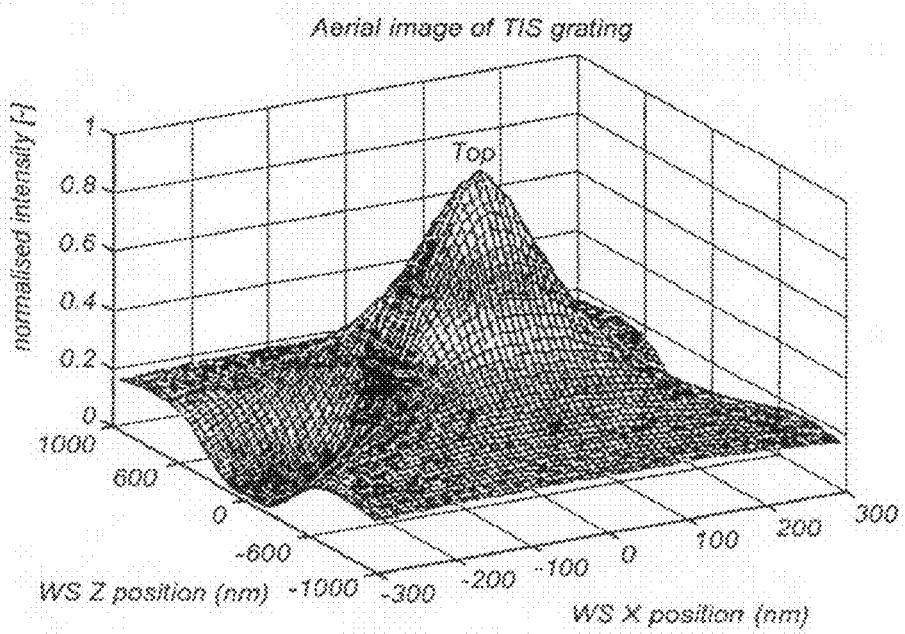

FIGS. 4a and 4b depict an exemplary intensity distribution of an aerial image detected by the device TIS for transmission image detection of FIG. 2 in a contour plot and a 3D plot, respectively.

The contour plot of FIG. 4a shows an intensity distribution in a horizontal direction-focus plane, e.g. a X-Z plane or a Y-Z plane. If the contour plot is for an X-Z plane, the intensity distribution is given for a fixed Y-position, and if the contour plot is for a Y-Z plane, the intensity distribution is given for a fixed X-position. The contour plots are compiled by modeling an image intensity of the slit pattern G1 at different locations within the X-Y surface for a number of different Z-positions. The scan paths are shown as solid lines with dots indicating the measured substrate table positions. The X, Y, and Z positions are determined by other means, e.g. by interferometry. As one can see from the scan paths, the measurement positions which were intended to be on an orthogonal grid, appear to be somewhat random. This is due to vibrations in the system.

The 3D plot of FIG. 4b is a modified representation of the data from FIG. 4a by plotting the intensity measured by the device TIS for transmission image detection as a third parameter along the z-axis of the plot.

From the data depicted in FIGS. 4a and 4b, the aligned position can be derived by fitting the shape of the measured aerial image to a model. Typically, the aligned position is derived by a parabolic fit on the top TOP of the aerial image peak (as shown in FIG. 4b). Alternative methods for fitting data, such as a Gaussian fit or a least squares fit, may be used as well.

One factor that influences the aerial image of the object mark G0 is a so-called illumination profile of the object mark, i.e. a profile of the angles from which radiation is incident on the object mark G0. In the most widely used, "conventional", illumination arrangement, there is a plane, referred to as a pupil plane PP, (and sometimes multiple planes) in the illumination system IL that is a Fourier transform of the object plane of the projection system PS, in which the mask MA is located. As is well known, a position in the pupil plane (expressed using normalized variables $\sigma_x$ and $\sigma_y$) translates to an angle $(\theta, \phi)$ at the object plane. Consequently, an angular distribution of the illumination of the object mark G0 can be determined by determining an intensity distribution in the pupil plane.

Illumination profiles are commonly referred to by the shape of the intensity distribution in the pupil plane and include: conventional illumination (defined by a pupil filling factor often referred to as a $\sigma$-setting), annular illumination (defined by inner and outer radii, often referred to as $\sigma_i$ and $\sigma_o$), dipole illumination and quadrupole illumination as well as combinations of these and more complex distributions. A lithographic apparatus may be provided with devices to define standard illumination profiles, with or without adjustable parameters, that are suitable for imaging common patterns, or devices to define custom illumination profiles for specific patterns. The present invention may be used with any lithographic apparatus having one or more devices to control or adjust the illumination profile.

Figure 5A:
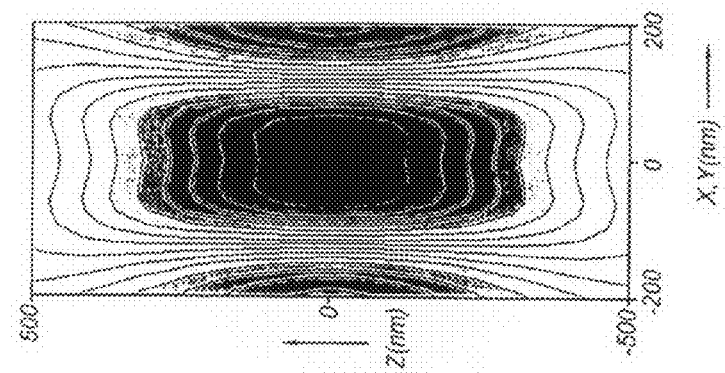
FIGS. 5a, 5b and 5c depict exemplary modeled intensity distributions of an aerial image to be detected by the device for transmission image detection of FIG. 3.
Figure 5B:
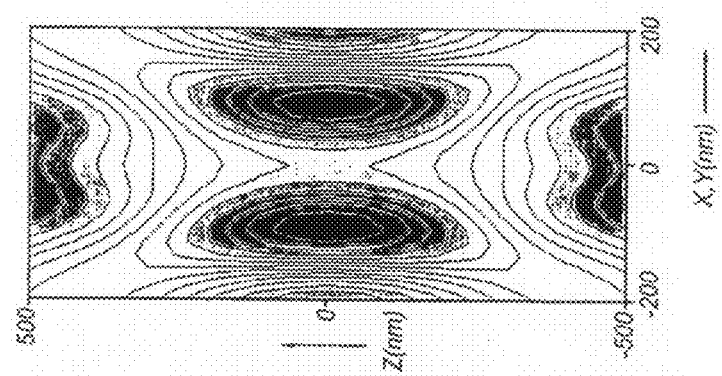
Figure 5C:
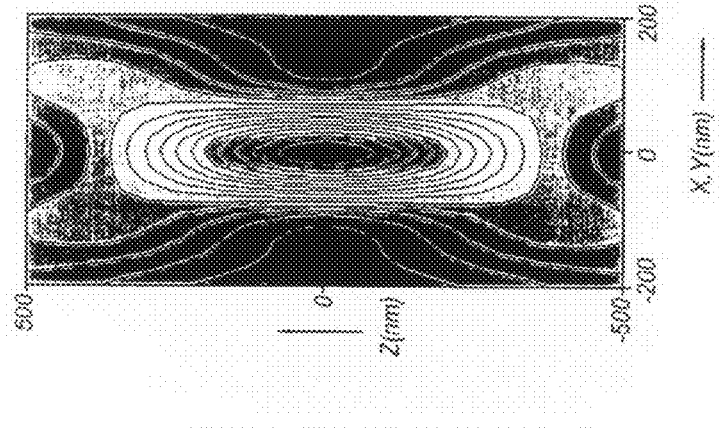

FIGS. 5a, 5b and 5c depict exemplary modeled intensity distributions of an aerial image detected by the device TIS for transmission image detection in a contour plot for different illumination settings, i.e. conventional illumination setting, dipole illumination setting and annular illumination setting, respectively.

Also, the contour plots in FIGS. 5a, 5b and 5c show an intensity distribution in a horizontal direction-focus plane, e.g. a X-Z plane or a Y-Z plane.

From the shown position-dependent modeled intensity data, an optimal position of a projected aerial image with respect to the coordinate system of the substrate table WT may be calculated. In an embodiment, for this purpose, a function is fitted on the position-dependent modeled intensity data from which a unique position may be calculated. This unique position, which not necessarily corresponds to the position with maximum measured or modeled intensity, although this may be the case, is then considered to be representative for the position of the aerial image.

In an embodiment, the number of fitting coefficients is limited to support a fast and stable optimization. In an embodiment, the function is scaleable. In such a case, the same function may be used at different illumination settings, i.e. the function provides a different aerial image height and width, but provides an aerial image of substantially similar shape.

As can be readily seen, the contour plot depicted in FIG. 5a enables a fit to determine the position of the mask MA with respect to the substrate table WT. That is, if aligned (X,Y=0), an intensity maximum is present at maximum focus (Z=0), and if not aligned (X,Y≠0), the intensity readily decreases at maximum focus (Z=0) or decreases less rapidly at other Z-positions (Z≠0). Additionally, such a fit may also be used to determine the position of the mask table MT with respect to the substrate table WT.

If a dipole illumination setting is used, as depicted in FIG. 5b, fitting becomes more difficult. At this setting, the aerial image has a substantially different shape. There are two intensity maxima at maximum focus (Z=0), in the case depicted in FIG. 5b at positions −100 and 100. It is therefore insufficient to apply a function that can be fitted by scaling. In fact, the aerial image as depicted in FIG. 5b by itself already requires a large number of coefficients to obtain a decent fit.

The shape of the aerial image of FIG. 5b is caused by destructive interference at the aligned position at best focus. Consequently, upon determining a certain intensity of the image of slit pattern G1, it is uncertain how the mask MA, or alternatively mask table MT, and substrate table WT are misaligned with respect to each other. This becomes even more difficult if the Z-position is less optimal, i.e. Z≠0.

Also, in case of the use of an annular illumination setting, as schematically depicted in FIG. 5c, determining the relative position of mask MA with respect to substrate table WT is not straightforward. In this case, a range of relative positions (horizontal direction) may fit the measured intensity of the aerial image transmitted through slit pattern G1, i.e. along the horizontal axis, the same shade of gray is present for a range of values. Moreover, even if the relative position can be determined, the focus position (vertical direction) remains uncertain because, for a range of focus position values, a similar intensity value can be found.

In lithographic systems having a projection system with a numerical aperture larger than 1, in particular larger than 1.2, it has been found that better results can be obtained by changing the characteristics of the object mark G0. In embodiments of the invention, a critical dimension of the object mark aerial image at an image plane of the projection system PS, also referred to as d, is chosen to be smaller than 0.85 times $$\frac{\lambda}{NA},$$

where λ represents the wavelength used to illuminate the object mark G0, and NA represents the numerical aperture of the projection system PS.

Amplitudes of diffraction orders formed by object mark G0 correspond with a sinc-function. At the optimum aligned position, all amplitudes in the aerial image are summed without having a phase-difference.

At a point in an illumination pupil, for σ=1 and a critical dimension $$d > \frac{\lambda}{2 \cdot NA},$$

diffraction orders with a negative amplitude occur within the NA of the projection system. Consequently, destructive interference comes into play. Due to the aforementioned destructive interference, local maxima in intensity appear in the aerial image away from the optimum aligned position, while at the optimum aligned position a local minimum may develop. The more extreme the aforementioned local minimum becomes, the harder it is to fit the aerial image in such a way that the optimum aligned position can be determined.

At and below $$d = \frac{\lambda}{2 \cdot NA},$$

destructive interference will not occur, even if σ=1. So, for $$d \leq \frac{\lambda}{2 \cdot NA},$$

there will never be a local minimum in the aerial image at the optimum aligned position.

For σ<1, the aforementioned discussion of critical dimension d still holds, but is further influenced by a factor $$\frac{1}{\sigma_{avg}},$$

where $\sigma_{avg}$ is the average angular distribution of light falling on the object mark G0. A typical $\sigma_{inner}$, i.e. the smallest distribution angle of light falling on the object mark G0, for dipole illumination settings is 0.7, which results in a typical $\sigma_{avg}$ of 0.85 for dipole illumination settings. A typical $\sigma_{inner}$ for annular illumination settings is 0.85, while a typical $\sigma_{outer}$, i.e. the largest distribution angle of light falling on the object mark G0, for annular illumination settings is 0.97. This would result in a typical $\sigma_{avg}$ of 0.91 for annular illumination settings. It must be understood that different values than the ones mentioned above may be used. For example, even annular illumination settings like $\sigma_{inner}$=0.91 and $\sigma_{outer}$=0.98 are used.

It follows that for $\sigma_{avg}$<1, the value for d at which destructive interference comes into play becomes larger. Additionally, it has been found that, due to convolution with the device TIS for transmission image detection, a small local minimum in the aerial image at the optimum aligned position can be compensated for. As a result, it has been found that below 0.85 times $$\frac{\lambda}{NA}$$

useful results can be obtained.

The critical dimension of the object mark aerial image at the image plane d corresponds to the critical dimension of the object mark G0 on the mask MA or, alternatively, mask table MT, also referred to as D. The critical dimension D is defined as the smallest dimension present in object mark G0 in a predetermined measurement direction. The difference between D and d is given by a magnification factor M, which is generally about 4 to 5 in a lithographic projection apparatus. Thus, D equals d·M. Therefore, in cases where the object mark comprises at least one rectangular structure having a length and a width, the width being smaller than the length, the aforementioned condition becomes:

$$D < 0.85 \cdot \left(\frac{\lambda}{NA}\right) \cdot M, \text{ where}$$

D represents the width of rectangular structure;
λ represents the wavelength used in a lithographic projection system;
NA represents the numerical aperture of the projection system PS; and
M represents the magnification factor of the projection system PS used in the lithographic projection system.

Figure 6A:
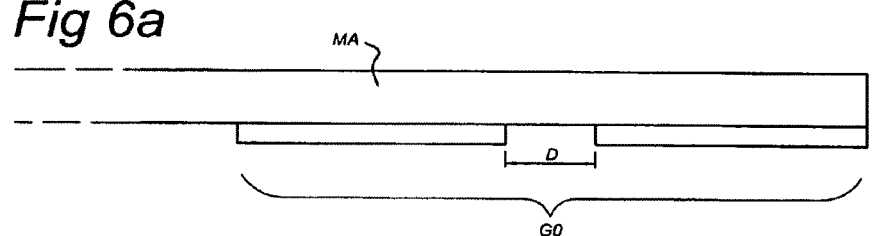
FIGS. 6a, 6b and 6c schematically depict object marks that may be used by a device for transmission image detection according to first, second, and third embodiments of the invention, respectively.
Figure 6B:
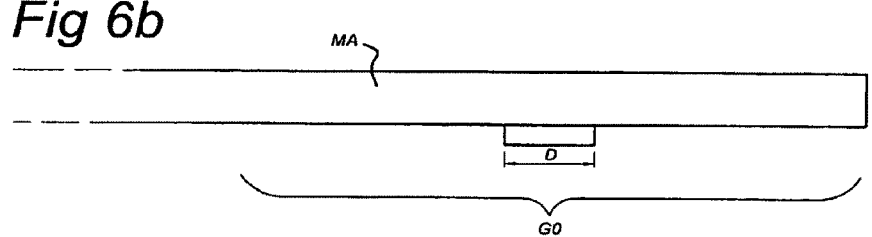
Figure 6C:
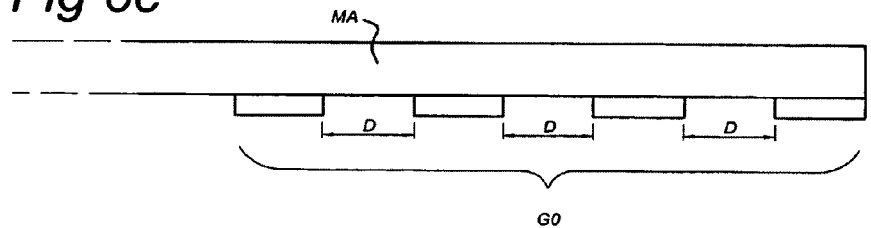

Typical types of object marks G0 that may be used in embodiments of the invention include an isolated slit (FIG. 6a), an isolated line (FIG. 6b) and a diffraction grating (FIG. 6c).

Experiments have shown that up to about $$d = 0.85 \cdot \frac{\lambda}{NA},$$

results are obtained which exceed results obtained for presently used object marks G0. Typically, at dipole illumination settings, in immersion lithography apparatus, the performance increases by about 30%.

The aforementioned dimensioning of d according to embodiments of the invention is especially suitable for use of wavelengths between 150 nm and 200 nm, and in particular 157 nm and 193 nm.

Figure 7A:
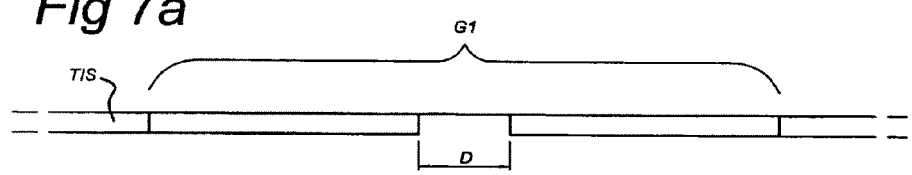
FIGS. 7 and 7b schematically depict slit patterns for use in a device for transmission image detection according to embodiments of the invention.
Figure 7B:
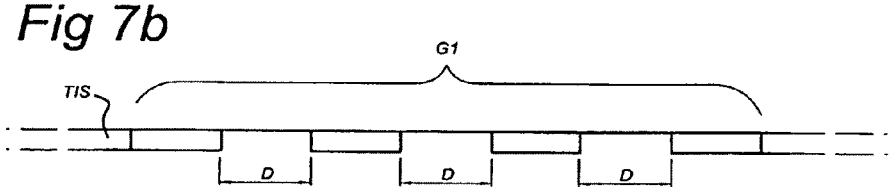

Typical types of slit patterns G1 that may be used in embodiments of the invention include a single slit (FIG. 7a) and a diffraction grating (FIG. 7b).

As mentioned earlier, it is possible to arrange different object marks G0 and slit patterns G1 adjacent to each other to obtain a capability of image detection for different orientations. In an embodiment, a first object mark G0 is an isolated line in a first direction, e.g. the X-direction, and a second object mark G0 is an isolated line in a second direction, orthogonal to the first direction, e.g. the Y-direction. With a suitable slit pattern G1, aerial images may be obtained for two different directions, i.e. in case of object mark G0 being arranged in the first direction or second direction respectively, the slit pattern G1 also being arranged in the first direction or second direction respectively. This enables a fit for different dipole illumination directions, i.e. dipole in the X-direction and dipole in the Y-direction, with a single arrangement.

The device TIS for transmission image detection may be located at the level of the substrate W and in particular such that the slit pattern G1 is at substantially the same distance from the final element of the projection system PS as the substrate W.

It should be understood that a processor 101 may be used in a computer assembly 100 as shown in FIG. 8 to use information acquired using embodiments of the device TIS for transmission image detection for positioning substrate table WT with or without substrate W with respect to mask MA or, alternatively, mask table MT. The computer assembly 100 may be a dedicated computer in the form of a control unit in embodiments of the assembly according to the invention or, alternatively, be a central computer controlling the lithographic projection apparatus. A memory 105 connected to processor 101 may comprise a number of memory components, such as a hard disk 111, Read Only Memory (ROM) 112, Electrically Erasable Programmable Read Only Memory (EEPROM) 113, and/or Random Access Memory (RAM) 114. Not all aforementioned memory components need to be present. Furthermore, it is not essential that the aforementioned memory components are physically in close proximity to the processor 101 or to each other. They may be located at a distance away.

The processor 101 may also be connected to some kind of user interface, for instance a keyboard 115 or a mouse 116. A touch-screen, track-ball, speech converter or other interfaces that are known to persons skilled in the art may also be used.

The processor 101 may be connected to a reading unit 117, which is arranged to read data from and under some circumstances store data on a data carrier, like a floppy disc 118 or a CDROM 119. Also DVD's or other data carriers known to persons skilled in the art may be used.

The processor 101 may also be connected to a printer 120 to print out output data on paper and/or may be configured to show the output data on a display 121, for instance a monitor or LCD (Liquid Crystal Display), of any other type of display known to a person skilled in the art.

The processor 101 may be connected to a communications network 122, for instance a public switched telephone network (PSTN), a local area network (LAN), a wide area network (WAN) etc. by way of transmitters/receivers 123 responsible for input/output (I/O). The processor 101 may be arranged to communicate with other communication systems via the communications network 122. In an embodiment of the invention, external computers (not shown), for instance personal computers of operators, can log into the processor 101 via the communications network 122.

The processor 101 may be implemented as an independent system or as a number of processing units that operate in parallel, wherein each processing unit is arranged to execute sub-tasks of a larger program. The processing units may also be divided into one or more main processing units with several subprocessing units. Some processing units of the processor 101 may even be located a distance away from the other processing units and communicate via communications network 122.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled person will appreciate that, in the context of such alternative applications, any use of the terms "wafer" or "die" herein may be considered synonymous with the more general terms "substrate" and "target portion," respectively. The substrate referred to herein may be processed before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 355, 248, 193, 157 or 126 nm).

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A device for transmission image sensing for sensing an aerial image in a lithographic exposure apparatus, the device comprising:
    a projection system arranged to form, at an image side of the projection system, an aerial image of an object mark, the image side having a numerical aperture larger than 1; and
    a detector comprising a slit pattern having features arranged to correspond to at least a part of the aerial image, the slit pattern being arranged to be exposed to the aerial image, the detector further being arranged to detect detection radiation transmitted by the slit pattern;
    wherein $$d < 0.85 \cdot \frac{\lambda}{NA},$$

where
    d represents the dimension of the smallest feature of the slit pattern,
    $\lambda$ represents the wavelength of the detection radiation, and
    NA represents the numerical aperture of the image side.

2. A device according to claim 1, wherein the wavelength ($\lambda$) is a wavelength between 150 and 200 nm.

3. A device according to claim 1, wherein the slit pattern comprises a pattern selected from a group of patterns comprising a single slit pattern, an isolated line pattern and a diffraction grating.

4. A device according to claim 1, wherein the object mark comprises a pattern selected from a group of patterns comprising a single slit pattern, an isolated line pattern, and a diffraction grating.

5. A device according to claim 1, wherein the projection system is arranged to project a patterned beam of exposure radiation on a substrate for exposing the substrate.

6. A device according to claim 1, comprising a support structure arranged to support a patterning device for patterning the exposure radiation, wherein the object mark is provided on the support structure or the patterning device.

7. A method for transmission image sensing of an aerial image comprising:
    providing detection radiation;
    using a projection system and the detection radiation to form on an image side of the projection system an aerial image of an object mark, the image side having a numerical aperture larger than 1;
    exposing a slit pattern to the image, the slit pattern having features corresponding to at least a part of the aerial image;
    detecting the detection radiation transmitted by the slit pattern;
    wherein $$d < 0.85 \cdot \frac{\lambda}{NA},$$

where
    d represents the smallest dimension of any feature in the aerial image,
    $\lambda$ represents the wavelength of the detection radiation, and
    NA represents the numerical aperture of the image side.

8. A method according to claim 7, wherein providing detection radiation comprises providing detection radiation with a wavelength between 150 and 200 nm.

9. A method according to claim 7, comprising providing the slit pattern with a pattern selected from a group of patterns comprising a single slit pattern, an isolated line pattern and a diffraction grating.

10. A method according to claim 7, wherein the object mark comprises a pattern selected from a group of patterns comprising a single slit pattern, an isolated line pattern, and a diffraction grating.

11. A method according to claim 7, comprising using the projection system to project a patterned beam of exposure radiation on a substrate for exposing the substrate.

12. A method according to 7, comprising patterning the exposure radiation with a patterning device supported on a support structure, and providing the object mark on the support structure or the patterning device.

* * * * *